(12) United States Patent
Iyengar et al.

(10) Patent No.: US 7,660,109 B2
(45) Date of Patent: Feb. 9, 2010

(54) APPARATUS AND METHOD FOR FACILITATING COOLING OF AN ELECTRONICS SYSTEM

(75) Inventors: Madhusudan K. Iyengar, Woodstock, NY (US); Vinod Kamath, Raleigh, NC (US); Jason A. Matteson, Raleigh, NC (US); Roger R. Schmidt, Poughkeepsie, NY (US); Mark E. Steinke, Durham, NC (US)

(73) Assignee: International Business Machines Corporation, Armonk, NY (US)

( * ) Notice: Subject to any disclaimer, the term of this patent is extended or adjusted under 35 U.S.C. 154(b) by 86 days.

(21) Appl. No.: 11/957,619

(22) Filed: Dec. 17, 2007

(65) Prior Publication Data

US 2009/0154096 A1    Jun. 18, 2009

(51) Int. Cl.
*H05K 7/20* (2006.01)
*F25D 23/12* (2006.01)

(52) U.S. Cl. .............. 361/679.47; 361/679.46; 361/679.5; 361/679.53; 361/695; 361/696; 361/698; 361/700; 361/701; 165/80.5; 165/104.33; 62/259.2

(58) Field of Classification Search . 361/679.46–679.5, 361/690, 694–696, 698–701, 704; 165/80.3–80.5, 165/104.33, 185; 62/259.2; 454/184
See application file for complete search history.

(56) References Cited

U.S. PATENT DOCUMENTS

| | | | |
|---|---|---|---|
| 4,011,905 A | 3/1977 | Millard | |
| 5,056,331 A | 10/1991 | Lotz | |
| 5,069,273 A * | 12/1991 | O'Hearne | ............. 165/206 |
| 5,467,250 A | 11/1995 | Howard et al. | |
| 5,706,668 A * | 1/1998 | Hilpert | ............. 62/259.2 |
| 5,896,922 A | 4/1999 | Chrysler et al. | |
| 6,164,369 A | 12/2000 | Stoller | |
| 6,205,796 B1 * | 3/2001 | Chu et al. | ............. 62/94 |

(Continued)

OTHER PUBLICATIONS

"Rack Cooler—A Cool Solution for X-Treme Density Rack Enclosure Systems", Liebert Corporation, Product Brochure, 8 pgs. (2001).

(Continued)

*Primary Examiner*—Jayprakash N Gandhi
*Assistant Examiner*—Robert J Hoffberg
(74) *Attorney, Agent, or Firm*—Geraldine Monteleone, Esq.; Kevin P. Radigan, Esq.; Heslin Rothenberg Farley & Mesiti, P.C.

(57) ABSTRACT

Apparatus and method are provided for facilitating air-cooling of an electronics system employing a vapor-compression heat exchange system, and front and back covers. An evaporator housing of the heat exchange system is mounted to a system housing of the electronics system and extends at least partially between air inlet and outlet sides of the system housing. The evaporator housing includes air inlet and outlet openings, and an evaporator. The front cover is mounted to the system or evaporator housing adjacent to the air inlet side or air outlet opening, and the back cover is mounted to the system or evaporator housing adjacent to the air outlet side or air inlet opening. Together, the system housing, back cover, evaporator housing and front cover define a closed loop airflow path passing through the system housing and evaporator housing, with the vapor-compression heat exchange system cooling air circulating therethrough.

19 Claims, 11 Drawing Sheets

U.S. PATENT DOCUMENTS

| | | | |
|---|---|---|---|
| 6,279,337 B1* | 8/2001 | Davidson et al. | 62/259.2 |
| 6,345,512 B1* | 2/2002 | Cosley et al. | 62/259.2 |
| 6,374,627 B1 | 4/2002 | Schumacher et al. | |
| 6,462,944 B1 | 10/2002 | Lin | |
| 6,535,382 B2 | 3/2003 | Bishop et al. | |
| 6,574,104 B2 | 6/2003 | Patel et al. | |
| 6,745,579 B2 | 6/2004 | Spinazzola et al. | |
| 6,746,212 B2 | 6/2004 | Payne | |
| 6,747,872 B1 | 6/2004 | Patel et al. | |
| 6,760,221 B2 | 7/2004 | Goth et al. | |
| 6,775,137 B2 | 8/2004 | Chu et al. | |
| 6,819,563 B1 | 11/2004 | Chu et al. | |
| 6,826,922 B2 | 12/2004 | Patel et al. | |
| 6,867,967 B2 | 3/2005 | Mok | |
| 6,896,612 B1 | 5/2005 | Novotny | |
| 6,924,981 B2 | 8/2005 | Chu et al. | |
| 7,086,247 B2 | 8/2006 | Campbell et al. | |
| 7,104,081 B2 | 9/2006 | Chu et al. | |
| 7,120,021 B2 | 10/2006 | Hamman | |
| 7,203,063 B2 | 4/2007 | Bash et al. | |
| 7,236,359 B2* | 6/2007 | Strobel | 361/679.21 |
| 7,315,448 B1* | 1/2008 | Bash et al. | 361/701 |
| 2004/0177948 A1 | 9/2004 | Cho et al. | |
| 2004/0231913 A1 | 11/2004 | McCombs et al. | |
| 2005/0217299 A1* | 10/2005 | Chu et al. | 62/259.2 |
| 2005/0225936 A1 | 10/2005 | Day | |
| 2005/0237716 A1 | 10/2005 | Chu et al. | |
| 2006/0126296 A1 | 6/2006 | Campbell et al. | |
| 2006/0232945 A1 | 10/2006 | Chu et al. | |
| 2006/0250770 A1 | 11/2006 | Campbell et al. | |
| 2007/0019380 A1 | 1/2007 | Campbell et al. | |
| 2007/0044493 A1* | 3/2007 | Kearney et al. | 62/259.2 |
| 2008/0060371 A1* | 3/2008 | Jude | 62/259.2 |
| 2009/0080173 A1* | 3/2009 | Porter et al. | 361/831 |

OTHER PUBLICATIONS

Teague, Paul E., "One Cool Machine", Design News for Mechanical and Design Engineers, Internet Article, 6 pgs. (Feb. 7, 2005).

Campbell et al., "Coolant Control Unit, and Cooled Electronics System and Method Employing the Same", U.S. Appl. No. 11/427,465, filed Jun. 29, 2006.

Campbell et al., "Cooled Electronics System and Method Employing Air-to-Liquid Heat Exchange and Bifurcated Air Flow", U.S. Appl. No. 11/467,245, filed Aug. 25, 2006.

Campbell et al., "Methods for Configuring Tubing for Interconnecting In-Series Multiple Liquid-Cooled Cold Plates", U.S. Appl. No. 11/620,088, filed Jan. 5, 2007.

Campbell et al., "System and Method of Facilitating Cooling of Electronics Racks of a Data Center Employing Multiple Cooling Stations", U.S. Appl. No. 11/744,269, filed May 4, 2007.

Porter et al., "Vapor-Compression Heat Exchange System with Evaporator Coil Mounted to Outlet Door Cover of an Electronics Rack", U.S. Appl. No. 11/860,634, filed Sep. 25, 2007.

Campbell et al., "Docking Station with Hybrid Air and Liquid Cooling of an Electronics Rack", U.S. Appl. No. 11/862,346, filed Sep. 27, 2007.

Iyengar et al., "Apparatus for Facilitating Cooling of an Electronics Rack Through the Use of an Air-to-Liquid Heat Exchanger", U.S. Appl. No. 11/939,650, filed Nov. 14, 2007.

* cited by examiner

APPARATUS AND METHOD FOR FACILITATING COOLING OF AN ELECTRONICS SYSTEM

TECHNICAL FIELD

The present invention relates in general to apparatuses and methods for facilitating cooling of an electronics system, such as a multi-blade center system, and more particularly, to apparatuses and methods for facilitating air-cooling of an electronics system by employing a vapor-compression heat exchange system and a closed loop airflow path through the electronics system to be cooled.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many server applications, processors along with their associated electronics (e.g., memory, disk drives, power supplies, etc.) are packaged in removable drawer or blade configurations disposed within a housing. In other cases, the electronics may be in fixed locations within the housing. Typically, the components are cooled by air moving in parallel air flow paths, usually front-to-back, impelled by one or more air moving devices (e.g., fans or blowers). In some cases it may be possible to handle increased power dissipation within a single drawer or blade by providing greater air flow, through the use of a more powerful air moving device or by increasing the rotational speed (i.e., RPMs) of an existing air moving device. However, this approach is becoming problematic at the system level.

SUMMARY OF THE INVENTION

The shortcomings of the prior art are overcome and additional advantages are provided through the provision of an apparatus for facilitating cooling of an air-cooled electronics system, wherein the air-cooled electronics system includes a system housing containing at least one electronics subsystem to be cooled. The apparatus includes a vapor-compression heat exchange system, a front cover and a back cover. The refrigerant-based, vapor-compression heat exchange system includes an evaporator housing and an evaporator disposed therein. The evaporator housing is configured to couple to a first side of the system housing to at least partially extend between an air inlet side and an air outlet side of the system housing. The evaporator housing includes an air inlet opening and an air outlet opening, and the vapor-compression heat exchange system further includes a vapor-compression unit in fluid communication with the evaporator for exhausting heat from the refrigerant circulating therethrough. The front cover is configured to mount to at least one of the system housing or the evaporator housing adjacent to the air inlet side of the system housing and the air outlet opening of the evaporator housing, and the back cover is configured to mount to at least one of the system housing or the evaporator housing adjacent to the air outlet side of the system housing or the air inlet opening of the evaporator housing. Together, the system housing, back cover, evaporator housing and front cover facilitate establishing a closed loop airflow path extending through the air inlet and air outlet sides of the system housing and through the air inlet and air outlet openings of the evaporator housing. When operational, the vapor-compression heat exchange system at least partially cools air circulating through the closed loop airflow path, thereby facilitating cooling of the at least one electronics subsystem of the electronics system.

In another aspect, a cooled electronics system is provided which includes an electronics system and an apparatus for facilitating cooling of the electronics system. The electronics system includes: at least one electronics subsystem requiring cooling; a system housing at least partially surrounding the electronics subsystem, the system housing including an air inlet side and an air outlet side, the air inlet and air outlet sides respectively enabling ingress and egress of air; and at least one air-moving device, the at least one air-moving device causing air to flow from the air inlet side of the system housing, across the at least one electronics subsystem to the air outlet side of the system housing. The apparatus includes a vapor-compression heat exchange system, a front cover and a back cover. The vapor-compression heat exchange system comprises an evaporator housing and an evaporator disposed therein. The evaporator housing is coupled to a first side of the system housing and extends at least partially between the air inlet side and the air outlet side of the system housing. The evaporator housing includes an air inlet opening and an air outlet opening, and the vapor-compression heat exchange system includes a vapor-compression unit in fluid communication with the evaporator for exhausting heat from the refrigerant circulating therethrough. The front door is mounted to at least one of the system housing or the evaporator housing adjacent to the air inlet side of the system housing or the air outlet opening of the evaporator housing, and the back door is mounted to at least one of the system housing or the evaporator housing adjacent to the air outlet side of the system housing or the air inlet opening of the evaporator housing. Together, the system housing, back cover, evaporator housing and front cover facilitate establishing a closed loop airflow path passing through the air inlet and air outlet sides of the system housing and through the air inlet and air outlet openings of the evaporator housing. When operational, the vapor-compression heat exchange system at least partially cools air circulating through the closed loop airflow path, thereby facilitating cooling of the at least one electronics subsystem of the electronics system.

In a further aspect, a method of facilitating cooling of an electronics system is provided, wherein the electronics system includes a system housing containing at least one electronics subsystem to be air-cooled. The method includes: obtaining a vapor-compression heat exchange system comprising an evaporator housing and an evaporator disposed therein, the evaporator housing being configured to couple to a first side of the system housing and extend at least partially between an air inlet side and an air outlet side of the system housing, the evaporator housing including an air inlet opening and an air outlet opening, wherein the vapor-compression heat exchange system further includes a vapor-compression unit in fluid communication with the evaporator for exhausting heat from refrigerant circulating therethrough; mounting the evaporator housing to the first side of the system housing; obtaining a front cover and a back cover, the front cover being configured and sized to cover an air inlet of the air inlet side of the system housing and the air outlet opening of the evaporator housing, and the back cover being configured and sized to cover an air outlet of the outlet side of the system housing and the air inlet opening of the evaporator housing; and mounting the front cover to at least one of the system housing or the evaporator housing to cover the air inlet of the system housing and the air outlet opening of the evaporator housing, and mounting the back cover to at least one of the system housing or the evaporator housing to cover the air outlet of the system housing and the air inlet opening of the evaporator housing, the front cover defining an air inlet plenum and the back cover defining an air outlet plenum, the air inlet plenum directing air from the air outlet opening of the evaporator housing to the air inlet side of the system housing and the air outlet plenum directing air from the air outlet of the system housing to the air inlet opening of the evaporator housing, wherein the system housing, back cover, evaporator housing and front cover together facilitate establishing a closed loop airflow path passing through the air inlet and air outlet sides of the system housing and through the air inlet and air outlet openings of the evaporator housing, and wherein when operational, the vapor-compression heat exchange system at least partially cools air circulating through the closed loop path, thereby facilitating cooling of the at least one electronics subsystem of the electronics system.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, the term "electronics system", includes any housing, frame, compartment, blade server system, etc., having one or more heat generating components of a computer system, and may be, for example, a stand alone computer processor having high, mid or low end processing capability. In one embodiment, an electronics system may comprise multiple electronics subsystems, each having one or more heat generating components disposed therein requiring cooling. "Electronics subsystem" refers to any sub-housing, blade, book, drawer, node, compartment, etc., having one or more heat generating electronics components disposed therein. Electronics subsystems of an electronics system may be movable or fixed relative to the electronics system, with the blades of a blade center system being one example of subsystems of an electronics system to be cooled.

"Vapor-compression heat exchange system" means any heat exchange mechanism characterized as described herein through which refrigerant can circulate; and includes, one or more discrete air-to-liquid evaporators coupled either in series or in parallel, and one or more discrete air-to-liquid condensers coupled either in series or in parallel. The one or more discrete air-to-liquid evaporators are referred to herein as an "evaporator: or an "air-to-liquid evaporator heat exchanger", and the one or more discrete air-to-liquid condensers are referred to herein as a "condenser" or an "air-to-liquid condenser heat exchanger". An evaporator or a condenser may comprise, for example, one or more coolant flow paths, formed of thermally conductive tubing (such as copper or other tubing) in thermal or mechanical contact with a plurality of air cooled cooling fins. Size, configuration and construction of components of the vapor-compression heat exchange system described herein can vary without departing from the scope of the present invention. Further, "data center" refers to a computer installation containing one or more electronics systems to be cooled. As a specific example, a data center may include one or more rows of rack-mounted computing units, such as server units.

One example of refrigerant which may be used in a vapor-compression heat exchange system such as described herein is a hydrofluorocarbon such as HFC R410a. However, the concepts disclosed herein are readily adapted to use with other types of refrigerant, while still maintaining the advantages and unique features of the present invention.

Reference is made below to the drawings, which are not drawn to scale and are simplified for ease of understanding, wherein the same reference numbers used throughout different figures designate the same or similar components.

Figure 1:
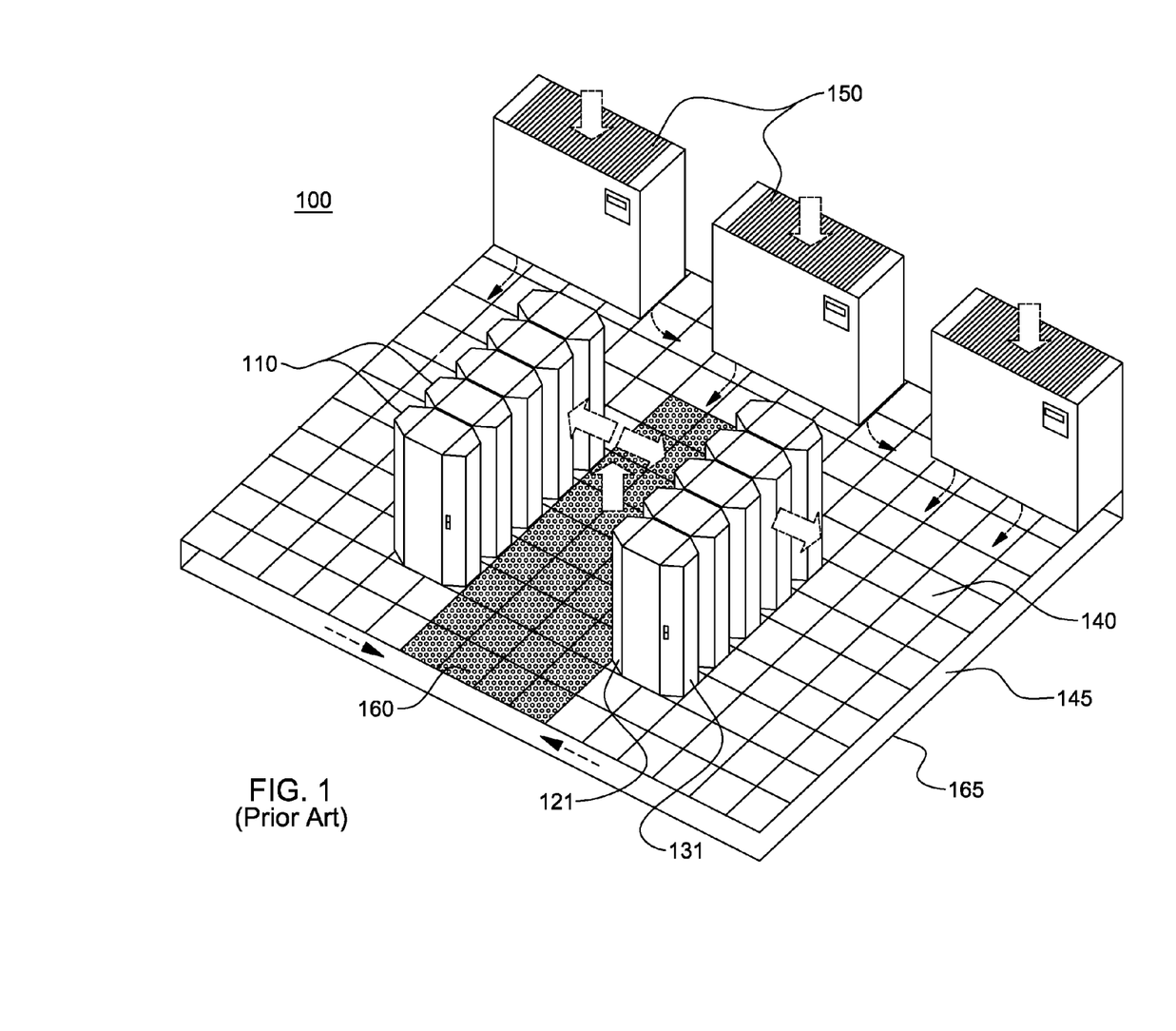
FIG. 1 depicts one embodiment of a conventional raised floor layout of an air-cooled data center.

As shown in FIG. 1, in a raised floor layout of an air cooled computer installation 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers 121 at air inlet sides of the electronics racks and expelled through louvered covers 131 at the air outlet sides of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" aisles of the computer installation defined by opposing air outlet sides of the electronics racks 110.

Figure 2:
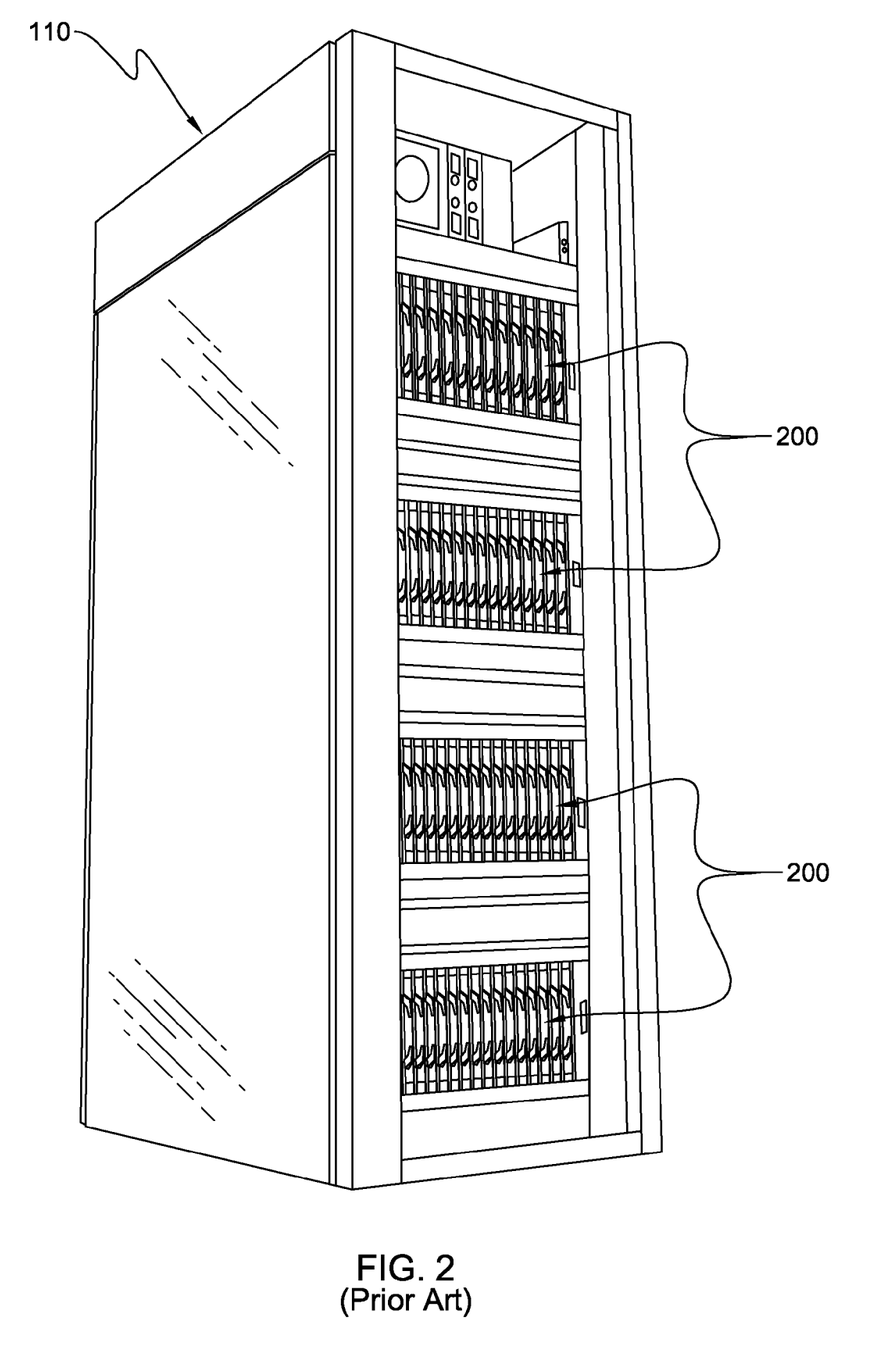
FIG. 2 depicts one embodiment of a conventional electronics rack employing a stack of multi-blade center systems.

FIG. 2 depicts and embodiment of electronics rack 110 comprising a stack of multi-blade center systems 200, as well as supporting power supplies, networking equipment, etc. These multi-blade center systems 200 are discussed further below.

Figure 3:
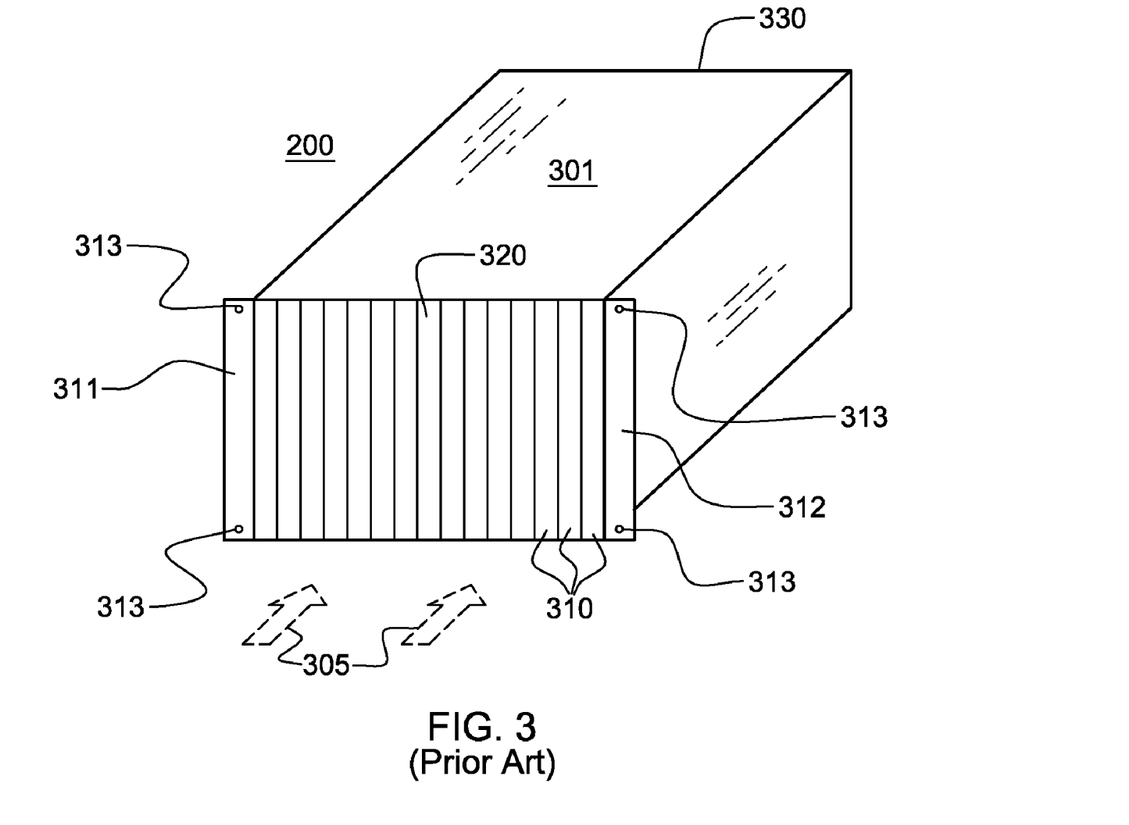
FIG. 3 is an isometric view of one embodiment of a conventional multi-blade center system.

FIG. 3 illustrates one embodiment of a multi-blade center system 200, one example of which is marketed by International Business Machines Corporation, of Armonk, N.Y. The multi-blade center system 200 is a stand alone server system which incorporates a scalable computing functionality up to, for example, fourteen high performance servers (or blades). Previous practice has been to employ multi-blade center system 200 as part of a stack of such systems in an electronics rack, such as depicted in FIG. 2. However, setup and operation of a data center such as depicted in FIG. 1, or even an electronics rack such as depicted in FIG. 2, is very expensive. It may be difficult for a small or medium-sized business to use an entire electronics rack because of the cost of constructing and operating the rack, and the "clean room" type attribute needed to air-cool the electronics rack. It is not possible to put an electronics rack such as depicted in FIG. 2 in a non-clean room environment because of the steady, uninterrupted supply of contaminant-free, cool air required. Described hereinbelow, therefore, are an apparatus and method which allow use of an electronics system, such as the multi-blade center system 200 of FIG. 3, in a sub-optimal (or even hostile) air cleanliness environment.

As shown in FIG. 3, multi-blade center system 200 includes a system housing 301 and multiple electronics subsystems 310. As one example, each electronics subsystem 310 is a server of a multi-server electronics system. A first flange 311 and second flange 312 with openings 313 are also illustrated. Typically, flanges 311, 312 are used to secure the multi-blade center system within an electronics rack, such as depicted in FIG. 2. Airflow 305 is through an air inlet side 320 of the multi-blade center system 200 to an air outlet side 330, and is established, for example, by two air-moving devices disposed at the back portion of the system housing. Electrical and networking infrastructure is also located near the back of system housing 301.

Figure 4:
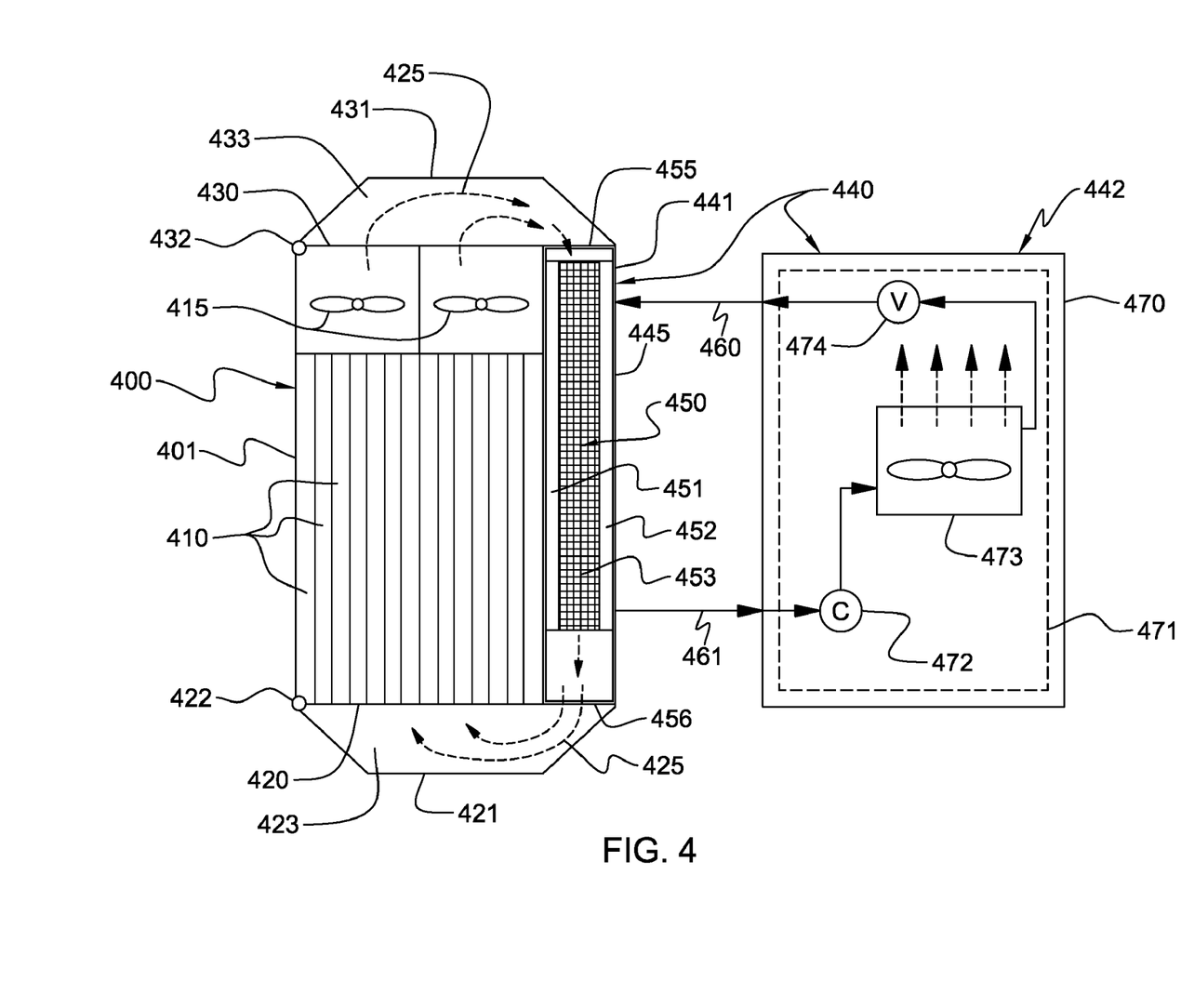
FIG. 4 is a schematic view of one embodiment of a cooled electronics system, in accordance with an aspect of the present invention.

FIG. 4 depicts one embodiment of a cooled electronics system, in accordance with an aspect of the present invention. In this embodiment, electronics system 400 includes a system housing 401 which contains a plurality of electronics subsystems 410, and multiple air-moving devices 415, which establish airflow from an air inlet side 420 to an air outlet side 430 of the system housing 401 across the electronics subsystems 410 for cooling the heat-generating components thereof. A front door 421 is configured to hingedly mount 422 along one edge to system housing 401, and a back door 431 is configured to hingedly mount 432 along one edge to system housing 401. Front door 421 defines an air inlet plenum 423, and back door 431 defines an air outlet plenum 433. Air inlet plenum 423 directs air to the air inlet side 420 of system housing 401, while outlet plenum 433 directs air from air outlet side 430 of system housing 401 to a vapor-compression heat exchange system 440 which includes an evaporator section 441 and a condenser section 442. Evaporator section 441 includes an evaporator housing 445 and an air-to-liquid evaporator heat exchanger (or evaporator) 450. Evaporator housing 445 has an air inlet opening 455 at a first end and an air outlet opening 456 at a second end. Air inlet and outlet openings 455, 456, respectively allow the ingress and egress of air through evaporator 450. Refrigerant passing through evaporator 450 cools the airflow before the air recirculates back to the air inlet side 420 of system housing 401. As illustrated, the air-to-liquid evaporator heat exchanger (or evaporator) 450 includes a refrigerant-liquid inlet plenum 451, a refrigerant-vapor outlet plenum 452 and multiple fluid-carrying tubes 453 connecting the refrigerant-liquid inlet plenum and refrigerant-vapor outlet plenum in fluid communication. Details of the air-to-liquid evaporator heat exchanger are described further below.

Condenser section 442 of vapor-compression heat exchange system 440 includes a condenser housing 470, and a vapor-compression unit 471 in fluid communication with evaporator 450 for exhausting heat from refrigerant circulating therethrough. Vapor-compression unit 471 includes a compressor 472, a condenser 473, and an expansion valve 474. In the embodiment depicted, condenser 473 is an air-cooled condenser, as described further below. Compressor 472, condenser 473 and expansion valve 474 are coupled in series fluid communication between a refrigerant return line 461 and refrigerant supply line 460 connecting condenser section 442 to evaporator section 441. When operational, evaporator 450 cools air circulating through the closed loop airflow path 425 defined by system housing 401, back door 431, evaporator housing 445 and front door 421.

More particularly, the vapor-compression heat exchange system 440 uses a circulating liquid refrigerant as the medium which absorbs and removes heat from air egressing from air outlet side 430 of system housing 401, and subsequently rejects the heat via the vapor-compression unit 471 to, for example, the room air. Circulating refrigerant enters compressor 472 in the thermodynamic state known as a saturated vapor and is compressed to a higher pressure, resulting in a higher temperature as well. The hot, compressed vapor is then in the thermodynamic state known as a super-heated vapor and it is at a temperature and pressure which can be condensed with typically available ambient air. The hot vapor is routed through condenser 473 where it is cooled and condensed into a liquid by flowing through a coil or tubes with ambient air flowing across the coil or tubes. This is where the circulating refrigerant rejects heat from the system and the rejected heat is carried away by the ambient air (or water, depending on the vapor-compression unit implementation).

The condensed liquid refrigerant, in the thermodynamic state known as a saturated liquid, is next routed through expansion valve 474, where the refrigerant undergoes an abrupt reduction in pressure. This pressure reduction results in evaporation of part of the liquid refrigerant, thereby further lowering the temperature of the liquid and vapor refrigerant mixture. The cold mixture is then routed through the evaporator, which in one embodiment, may comprise one or more discrete heat exchange tube sections, as explained further below. Fans 415 establish a warm airflow egressing from system housing 401. This warm airflow is cooled by the refrigerant passing through evaporator 450, with cooled air egressing from the evaporator and being returned via air inlet plenum 423 to the air inlet side 420 of system housing 401.

The warm air passing across the evaporator evaporates the liquid part of the cold refrigerant mixture within the evaporator. At the same time, the circulating air is cooled, thus lowering the temperature of the air egressing from the evaporator. The evaporator is thus where the circulating refrigerant absorbs and removes heat, which is subsequently rejected in the condenser and transferred elsewhere by the air used in the condenser (or alternatively, by water or other liquid coolant employed). The refrigeration cycle then repeats, with the refrigerant-vapor from the evaporator being routed back to the compressor. By way of example, the warm air ingressing to the evaporator might be in the range of 45-55° C., while the cooled air egressing from the evaporator might be 24-25° C.

Figure 5:
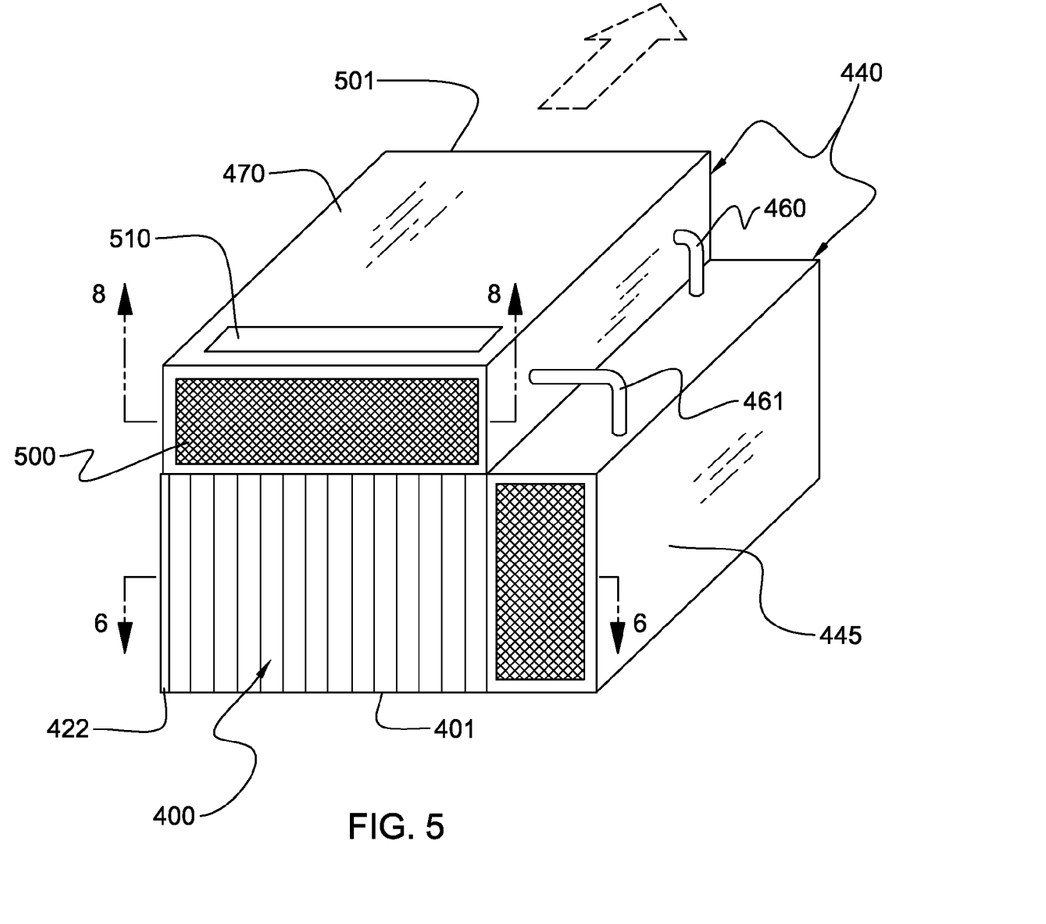
FIG. 5 is an isometric view of one partial embodiment of a cooled electronics system, in accordance with an aspect of the present invention.

FIG. 5 is a partial isometric view of one embodiment of the cooled electronics system of FIG. 4. In this embodiment, the front and back doors are not shown, and the vapor-compression heat exchange system 440 is configured to mount to electronics system 400 with evaporator housing 445 mounted to a first side of system housing 401 to extend at least partially between the air inlet and air outlet sides thereof, and the condenser housing 470 mounted to a top surface of system housing 401. When mounted as illustrated, the evaporator housing 445 and condenser housing 470 are coupled to orthogonal sides of system housing 401. The evaporator within evaporator housing 445 is in fluid communication with the vapor-compression unit within condenser housing 470 via refrigerant supply line 460 and refrigerant return line 461.

As noted, in one embodiment, the condenser comprises an air-to-liquid condenser heat exchanger which is air-cooled by, for example, ambient air drawn in through an air intake 500 in condenser housing 470 and expelled through an outlet 501 at a back of the condenser housing. By way of example, a typical range for the ambient air might be 15-40° C. An air filter 510 is disposed adjacent to air intake 500 for removing particulate from the ambient air prior to use of the air to cool refrigerant circulating through the condenser. In one embodiment, this air filter 510 is a field replaceable filter.

By way of one detailed example, the system housing is (in one example) 12-16 inches high, 19 inches wide and 40 inches deep, the evaporator housing is 12-16 inches high, 8-12 inches wide and 40 inches deep, and the vapor-compression unit housing is 5-10 inches high, 19 inches wide and 40 inches deep. These dimensions are provided by way of example only, and illustrate that the electronics system to be cooled, as well as the apparatus cooling the system, are sufficiently small to reside on a table. The closed loop airflow path established through the system housing and evaporator housing, as well as the use of the air filtering within the condenser housing, allow the cooled electronics system to be disposed in a non-clean room environment, which as noted, is particularly advantageous for small and medium-sized businesses.

Figure 6:
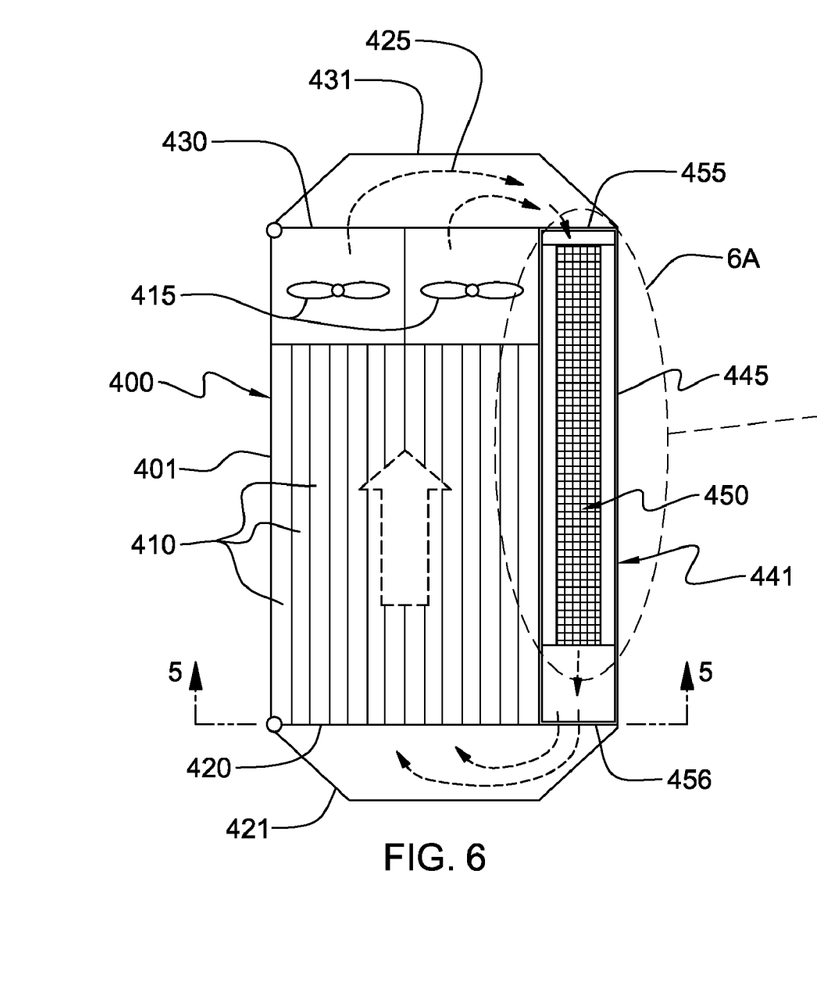
FIG. 6 is a cross-sectional plan view of the cooled electronics system of FIG. 5, taken along line 6-6, in accordance with an aspect of the present invention.
Figure 6A:
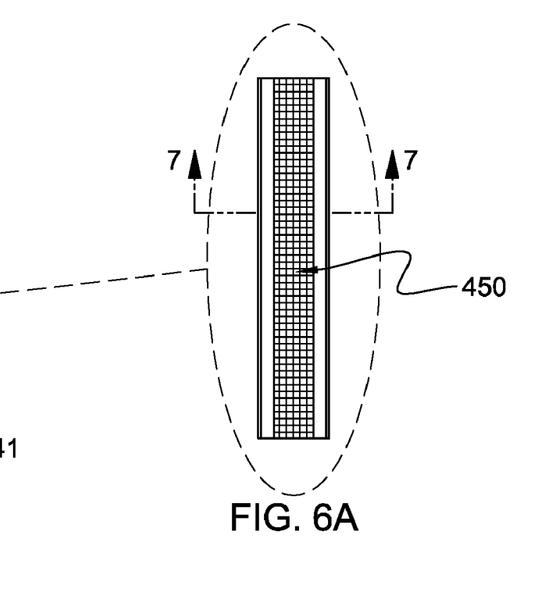
FIG. 6A is a split-out view of the air-to-liquid evaporator heat exchanger of FIG. 6, in accordance with an aspect of the present invention.

FIGS. 6 & 6A are a cross-sectional illustration of electronics system 400 and evaporator section 441 of the vapor-compression heat exchange system of FIG. 5, taken along line 6-6. As noted, evaporator section 441 is configured to mount to a side of system housing 401 of electronics system 400 and extend at least partially between air inlet side 420 and air outlet side 430 of system housing 401. Air circulates in a closed loop airflow path 425 defined by system housing 401, back door 431, evaporator housing 445 of evaporator section 441, and front door 421. Airflow through the closed loop airflow path is established via one or more air-moving devices 415 disposed, for example, in the back portion of system housing 401 behind the plurality of electronics subsystems 410. The closed loop airflow path is established by configuring and sizing front door 421 and back door 431 to cover the air inlet and air outlet sides of system housing 401, as well as the air inlet opening 455 and air outlet opening 456 of evaporator housing 445.

Figure 7:
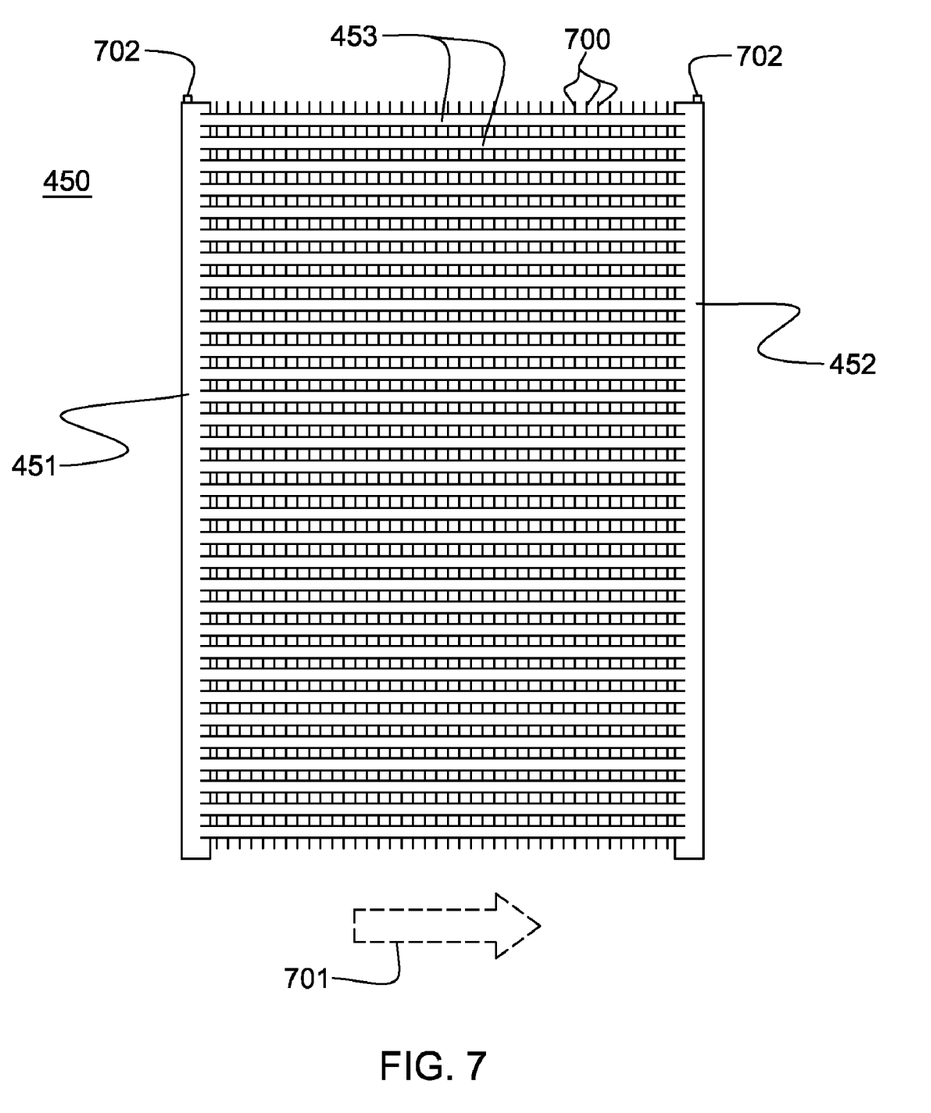
FIG. 7 is a cross-sectional elevational view of the air-to-liquid evaporator heat exchanger of FIGS. 6 & 6A, taken along line 7-7, in accordance with an aspect of the present invention.

FIG. 7 is a cross-sectional elevational view of the evaporator 450 illustrated in FIG. 6A, taken along line 7-7. As shown in FIG. 7, evaporator 450 is an air-to-liquid evaporator heat exchanger which comprises a refrigerant-liquid inlet plenum 451, a refrigerant-vapor outlet plenum 452 and multiple fluid-carrying tubes 453 connecting the refrigerant-liquid inlet plenum 451 and refrigerant-vapor outlet plenum 452 in fluid communication. In one embodiment, the multiple fluid-carrying tubes 453 are a plurality of horizontally-oriented tube sections, each comprising a coolant channel having an inlet and an outlet, with each coolant channel inlet being coupled to the refrigerant-liquid inlet plenum 451 and each coolant channel outlet being coupled to the refrigerant-vapor outlet plenum 452. A plurality of vertically-oriented, rectangular fins 700 are attached to the multiple fluid-carrying tubes 453. The direction of fluid flow 701 is from left to right, with the refrigerant absorbing air-to-liquid evaporator heat exchanger. Air-purge valves 702 are illustrated at the upper portion of each plenum to facilitate purging air from the respective plenums, for example, during charging of the vapor-compression heat exchange system with refrigerant.

Figure 8:
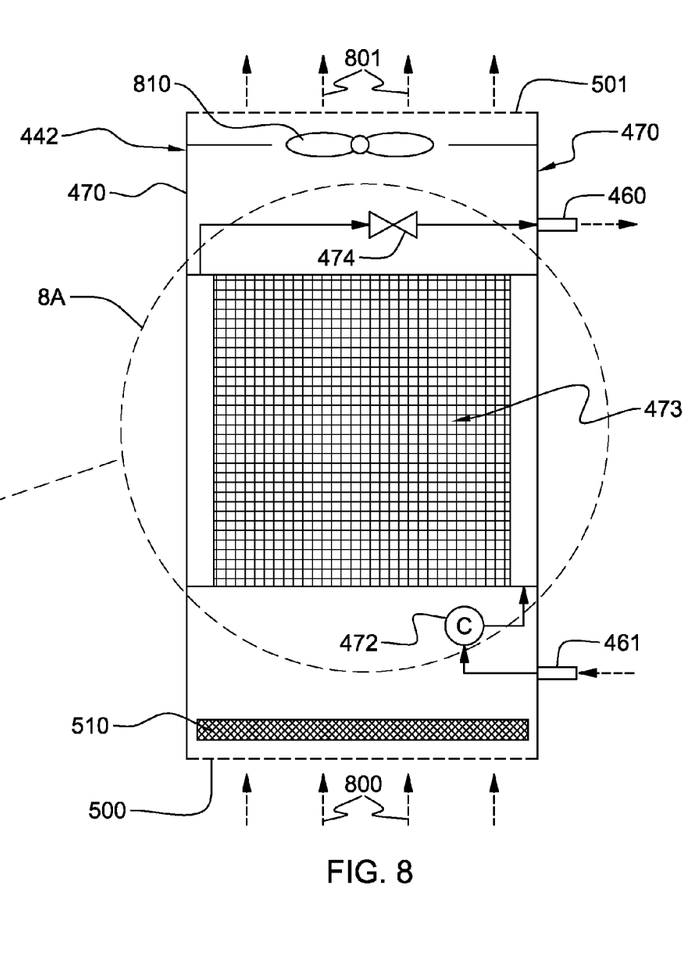
FIG. 8 is a cross-sectional plan view of the condenser section of the cooled electronics system of FIG. 5, taken along line 8-8, in accordance with an aspect of the present invention.
Figure 8A:
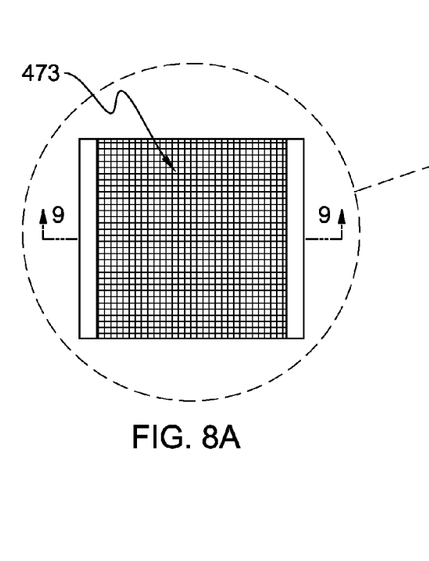
FIG. 8A is a split-out of the air-to-liquid condenser heat exchanger of FIG. 8, in accordance with an aspect of the present invention.

FIGS. 8 & 8A depict a plan view of one embodiment of the condenser section 442 of FIG. 5, taken along line 8-8. As noted above, condenser section 442 includes a condenser housing 470 which has an air intake 500 through which ambient air 800 passes to cool condenser 473, and an air outlet 501 which exhausts heated air 801. Air filter 510 is disposed adjacent to air intake 500 to remove contaminants from the air prior to passing through the vapor-compression unit. The refrigerant loop within the vapor-compression unit includes the series-connected compressor 472, condenser 473 and expansion valve 474. These components are connected between refrigerant return line 461 and refrigerant supply line 460, and are in fluid communication with the evaporator section (described above) of the heat from the air via latent heat vaporization as the air passes across the vapor-compression heat exchange system. One or more air-moving devices 810 draw ambient air through the condenser section 442.

Operationally (as described in detail above), refrigerant that has absorbed heat from the evaporator section is compressed by compressor 472 and forced through condenser heat exchanger 473, where the liquid-vapor mixture turns to liquid. Subsequent to this, the liquid refrigerant is throttled (expanded) in expansion valve 474 and cooled, and then returned to the evaporator section for further cooling of air circulating through the closed loop airflow path. The condenser heat exchanger can be a similar fin and tube design as the evaporator heat exchanger employed in the evaporator section, or a more advanced plate fin and flat tube structure design. Further, the insides of the tubes could have internal microstructures to enhance vaporization or condensation in the evaporator or condenser, respectively.

Figure 9:
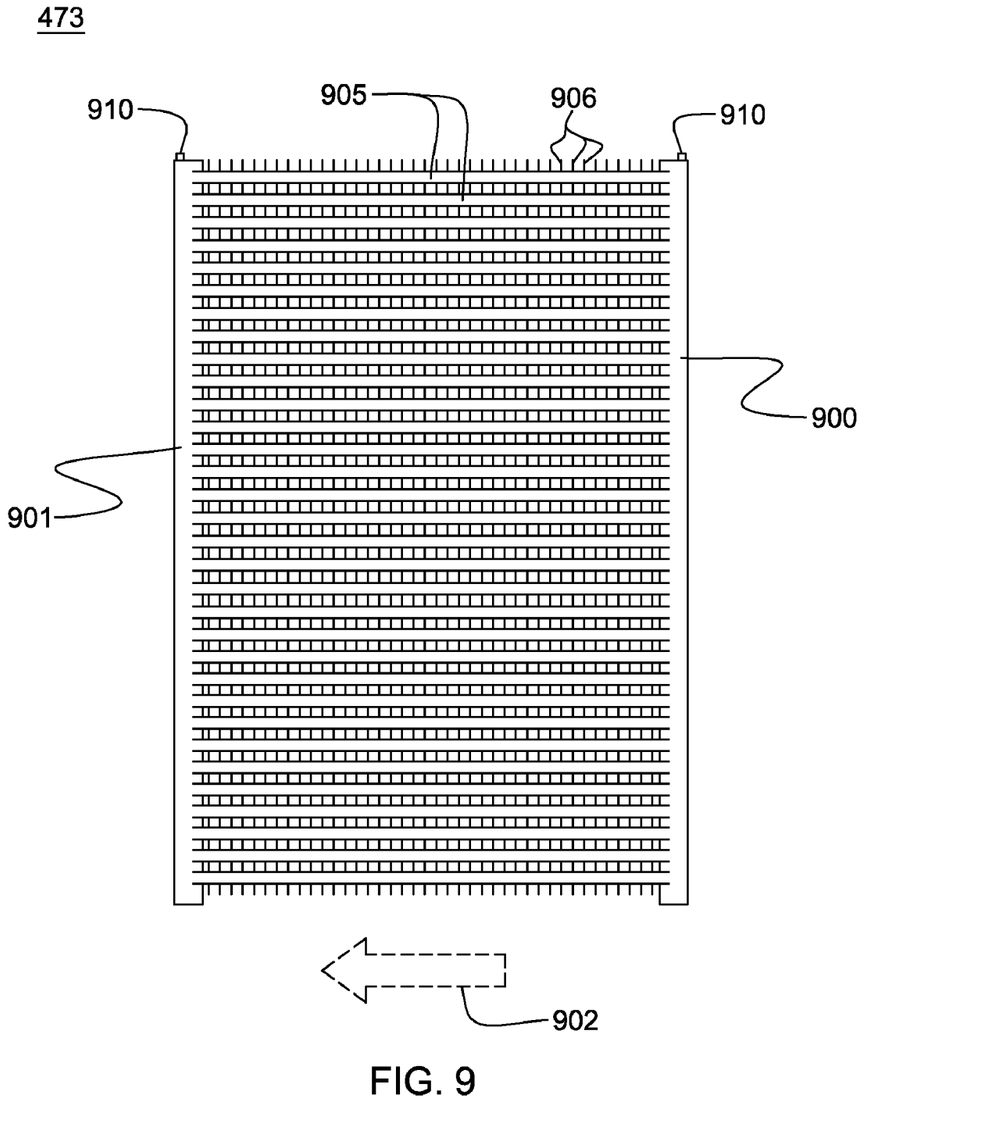
FIG. 9 is a cross-sectional elevational view of the air-to-liquid condenser heat exchanger of FIG. 8A, taken along line 9-9, in accordance with an aspect of the present invention.

One embodiment of the air-to-liquid condenser heat exchanger 473 of FIGS. 8 & 8A is depicted in cross-sectional elevational view in FIG. 9, taken along line 9-9 of FIG. 8A. As illustrated, air-to-liquid condenser heat exchanger includes a refrigerant-vapor inlet plenum 900, multiple fluid-carrying tubes 905 and a refrigerant-liquid outlet plenum 901. As one example, the multiple fluid-carrying tubes 905 comprise multiple heat exchange tube sections, each of which includes a coolant channel having an inlet and an outlet, with each coolant channel inlet being coupled to the refrigerant-vapor inlet plenum 900 and each coolant channel outlet being coupled to the refrigerant-liquid outlet plenum 901. In the embodiment illustrated, these heat exchange tube sections are horizontally-oriented tube sections, and a plurality of vertically-oriented fins 906 attach to the tube sections for facilitating transfer of heat from refrigerant passing through the air-to-liquid condenser heat exchanger to air passing across the heat exchanger. The direction of refrigerant flow 902 is from right to left in FIG. 9. Air bleed valves 910 are also illustrated at the upper portion of refrigerant-vapor inlet and refrigerant-liquid outlet plenums 900, 901 to facilitate charging of the vapor-compression heat exchange system.

Figure 10:
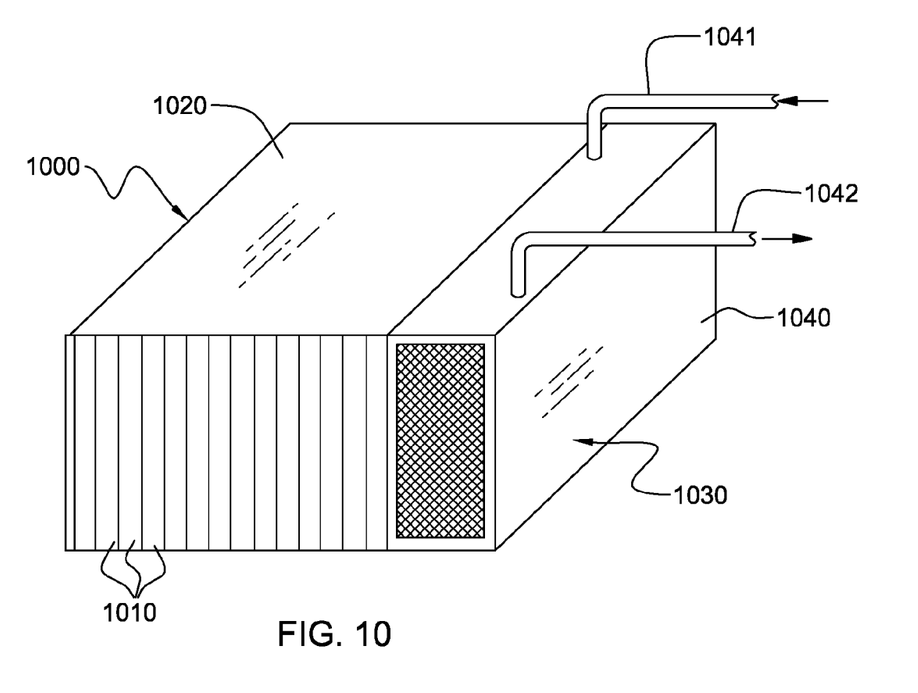
FIG. 10 is an isometric view of a partial alternate embodiment of a cooled electronics system, in accordance with an aspect of the present invention.

FIG. 10 is a partial depiction of an alternate embodiment of a cooled electronic system, in accordance with an aspect of the present invention. In this example, the condenser section (not shown) is disposed remote from the electronics system 1000 being cooled. Only the evaporator section 1030 and the electronics system 1000 are shown, with refrigerant being circulated between evaporator section 1030 and the condenser section via refrigerant supply line 1041 and refrigerant return line 1042. Because the vapor-compression heat exchange system is refrigerant-based, these supply and return lines may advantageously be relatively long, allowing the condenser section to reside, for example, outside the room containing electronics system 1000 being cooled. In the illustrated embodiment, electronics system 1000 includes a plurality of electronics subsystems 1010 disposed within a system housing 1020. Evaporator section 1030 includes an evaporator housing 1040 which is mounted to a side of system housing 1020 and extends between an air inlet side and an air outlet side of the system housing in a similar manner to the cooled electronics system embodiment of FIGS. 4-9. Further, the front and back doors for the alternate embodiment depicted in FIG. 10 are not shown. Similar to the embodiments of FIGS. 4-9, the front door, system housing 1020, back door and evaporator housing 1040 are configured to define a closed airflow path through which air circulates and is cooled by the vapor-compression heat exchange system.

Figure 11:
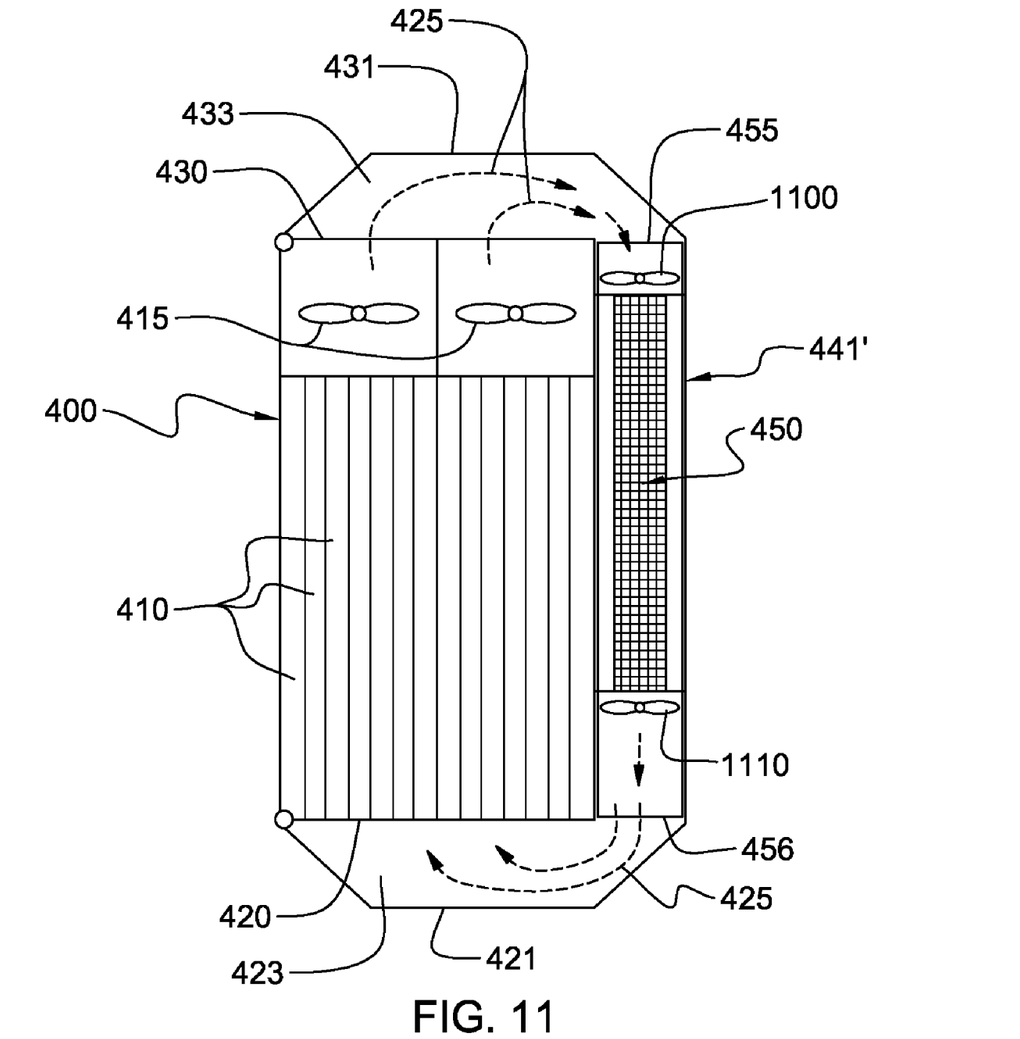
FIG. 11 is a cross-sectional plan view of another partial, alternate embodiment of a cooled electronics system, in accordance with an aspect of the present invention.

FIG. 11 depicts a further alternate embodiment of a cooled electronics system, in accordance with an aspect of the present invention. This embodiment is identical to that described above in connection with FIGS. 4-9, with the exception of the inclusion of additional air-moving devices in evaporator section 441 of the vapor-compression heat exchange system. Note that although in this figure the condenser section is not shown, it may be similar to that described above in connection with the embodiment of FIGS. 4-9.

As illustrated in FIG. 11, electronics system 400 includes a plurality of electronics subsystems 410 across which airflow is established via one or more air-moving devices 415. Air enters air inlet side 420 of the electronics system and exhausts via air outlet side 430. A front door 421 hingedly connects along one edge to electronics system 400 and a back door 431 hingedly connects along one edge to electronics system 400. The front and back doors are sized to establish an air inlet plenum 423 and air outlet plenum 433, respectively, for turning airflow between the electronics system and the evaporator section. Evaporator section 441' includes an air-to-liquid evaporator heat exchanger 450, such as described above in connection with FIGS. 5-7. Evaporator section 441' further includes an air inlet opening 455 and an air outlet opening 456. Together, the evaporator section, air inlet plenum, electronics system and air outlet plenum define a closed loop airflow path 425 through which air circulates.

In the embodiment of FIG. 11, airflow through the closed loop airflow path is further facilitated by the addition of one or more auxiliary air-moving devices disposed within evaporator section 441'. A first air-moving device 1100 is shown disposed adjacent to air inlet opening 455 of evaporator section 441', and a second air-moving device 1110 is illustrated adjacent to air outlet opening 456 of evaporator section 441'.

Typically, a coefficient of performance of an apparatus such as described above in connection with FIGS. 4-11 will be about 3. Therefore, to cool an 8 kW electronics system, about 11.3 kW of total heat load will be rejected to the ambient surroundings. For most non-clean room applications, this would be an acceptable heat load.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. An apparatus for facilitating cooling of an air-cooled electronics system, the air-cooled electronics system comprising a system housing containing at least one electronics subsystem to be air-cooled, the apparatus comprising:

a vapor-compression heat exchange system comprising an evaporator housing and an evaporator disposed therein, the evaporator housing being configured to couple to a first side of the system housing to extend at least partially between an air inlet side and an air outlet side of the system housing, the evaporator housing comprising an air inlet opening and an air outlet opening, wherein the vapor-compression heat exchange system further comprises a vapor-compression unit in fluid communication with the evaporator for exhausting heat from refrigerant circulating therethrough;

a front cover and a back cover, the front cover being configured to mount to at least one of the system housing or the evaporator housing adjacent to the air inlet side of the system housing or the air outlet opening of the evaporator housing, and the back cover being configured to mount to at least one of the system housing or the evaporator housing adjacent to the air outlet side of the system housing or the air inlet opening of the evaporator housing, wherein the system housing, back cover, evaporator housing and front cover together facilitate establishing a closed loop airflow path passing through the air inlet and air outlet sides of the system housing and through the air inlet and air outlet openings of the evaporator housing, and wherein when operational, the vapor-compression heat exchange system at least partially cools air circulating through the closed loop airflow path, thereby facilitating cooling of the at least one electronics subsystem of the electronics system; and a condenser housing enclosing the vapor-compression unit, the condenser housing being configured to mount to a top side of the system housing, and wherein the vapor-compression unit comprises an air-to-liquid condenser heat exchanger and an air-moving device for establishing ambient airflow across the air-to-liquid condenser heat exchanger, wherein ambient airflow across the air-to-liquid condenser heat exchanger is outside the closed loop airflow path facilitated by the back cover, evaportor housing, front cover and system housing, and is from an air inlet side to an air outlet side of the condenser housing, and wherein the air inlet side of the condenser housing is in a plane parallel to the air inlet side of the system housing, and the air outlet side of the condenser housing is in a plane parallel to the air outlet side of the system housing.

2. The apparatus of claim 1, wherein the front cover comprises a front door configured to hingedly mount along one edge to one of the system housing or the evaporator housing, and wherein the back cover comprises a back door configured to hingedly mount along one edge to one of the system housing or the evaporator housing.

3. The apparatus of claim 1, wherein the condenser housing has a width and a depth equal to a width and a depth, respectively, of the system housing.

4. The apparatus of claim 1, wherein the vapor-compression unit further comprises an air filter for filtering ambient air drawn through the vapor-compression unit by the air-moving device.

5. The apparatus of claim 1, wherein the vapor-compression unit further comprises an expansion valve and a compressor, and wherein the air-to-liquid condenser heat exchanger comprises a refrigerant-vapor inlet plenum, a refrigerant-liquid outlet plenum and multiple fluid-carrying tubes connecting the refrigerant-vapor inlet plenum and refrigerant-liquid outlet plenum in fluid communication, the compressor being coupled in fluid communication between the evaporator and the refrigerant-vapor inlet plenum, and the expansion valve being coupled in fluid communication between the refrigerant-liquid outlet plenum and the evaporator.

6. The apparatus of claim 5, wherein the evaporator comprises an air-to-liquid evaporator heat exchanger, the air-to-liquid evaporator heat exchanger comprising a refrigerant-liquid inlet plenum, a refrigerant-vapor outlet plenum and multiple fluid-carrying tubes connecting the refrigerant-liquid inlet plenum and refrigerant-vapor outlet plenum in fluid communication.

7. The apparatus of claim 1, further comprising at least one air-moving device disposed adjacent to at least one of the air inlet opening or the air outlet opening of the evaporator housing.

8. The apparatus of claim 7, wherein the at least one air-moving device comprises a first air-moving device disposed adjacent to the air inlet opening of the evaporator housing, and a second air-moving device disposed adjacent to the air outlet opening of the evaporator housing, wherein the first air-moving device and the second air-moving device facilitate establishing of a circulating airflow through the closed loop airflow path.

9. A cooled electronics system comprising:
an electronics system, the electronics system comprising:
at least one electronics subsystem to be cooled;
a system housing at least partially surrounding the at least one electronics subsystem, the system housing comprising an air inlet side and an air outlet side, the air inlet and air outlet sides respectively enabling ingress and egress of air;
at least one air-moving device, the at least one air-moving device causing air to flow from the air inlet side of the system housing, across the at least one electronics subsystem to the air outlet side of the system housing; and
an apparatus for facilitating cooling of the electronics system, the apparatus comprising:
a vapor-compression heat exchange system comprising an evaporator housing and an evaporator disposed therein, the evaporator housing being coupled to a first side of the system housing and extending at least partially between the air inlet side and the air outlet side of the system housing, the evaporator housing comprising an air inlet opening and an air outlet opening, and wherein the vapor-compression heat exchange system further comprises a vapor-compression unit in fluid communication with the evaporator for exhausting heat from refrigerant circulating therethrough;
a front cover and a back cover, the front cover being mounted to at least one of the system housing or the evaporator housing adjacent to the air inlet side of the system housing or the air outlet opening of the evaporator housing, and the back cover being mounted to at least one of the system housing or the evaporator housing adjacent to the air outlet side of the system housing or the air inlet opening of the evaporator housing, wherein the system housing, back cover, evaporator housing and front cover together facilitate establishing a closed loop airflow path passing through the air inlet and air outlet sides of the system housing and through the air inlet and air outlet openings of the evaporator housing, and wherein the vapor-compression heat exchange system at least partially cools air circulating through the closed loop airflow path, thereby facilitating cooling of the at least one electronics subsystem of the electronics system; and
a condenser housing enclosing the vapor-compression unit, the condenser housing being mounted to a top side of the system housing, and wherein the vapor-compression unit comprises an air-to-liquid condenser heat exchanger and an air-moving device for establishing ambient airflow across the air-to-liquid condenser heat exchanger, wherein ambient airflow across the air-to-liquid condenser heat exchanger is outside the closed loop airflow path facilitated by the back cover, evaporator housing, front cover and system housing, and is from an air inlet side to an air outlet side of the condenser housing, and wherein the air inlet side of the condenser housing is in a plane parallel to the air inlet side of the system housing, and the air outlet side of the condenser housing is in a plane parallel to the air outlet side of the system housing.

10. The cooled electronics system of claim 9, wherein the air inlet opening of the evaporator housing is disposed adjacent to the air outlet side of the electronics housing, and the air outlet opening of the evaporator housing is disposed adjacent to the air inlet side of the system housing, and wherein the system housing is configured to reside on a table.

11. The cooled electronics system of claim 10, wherein the electronics system is a multi-blade center system comprising the at least one air-moving device for establishing airflow across multiple blades of the multi-blade center system, wherein each blade of the multiple blades is an electronics subsystem.

12. The cooled electronics system of claim 9, wherein the front cover comprises a front door hingedly mounted along one edge to one of the system housing or the evaporator housing, and wherein the back cover comprises a back door hingedly mounted along one edge to one of the system housing or the evaporator housing, the front door defining in part an air inlet plenum and the back door defining in part an air outlet plenum, the closed loop airflow path passing through the air inlet plenum and the air outlet plenum.

13. The cooled electronics system of claim 9, wherein the condenser housing has a width and a depth equal to a width and a depth, respectively, of the system housing.

14. The cooled electronics system of claim 9, wherein the first side and the top side of the system housing are orthogonally-oriented sides of the system housing.

15. The cooled electronics system of claim 9, wherein the vapor-compression unit further comprises an expansion valve and a compressor, and the air-to-liquid condenser heat exchanger comprises a refrigerant-vapor inlet plenum, a refrigerant-liquid outlet plenum and multiple fluid-carrying tubes connecting the refrigerant-vapor inlet plenum and refrigerant-liquid outlet plenum in fluid communication, the compressor being coupled in fluid communication between the evaporator and the refrigerant-vapor inlet plenum, and the expansion valve being coupled in fluid communication between the refrigerant-liquid outlet plenum and the evaporator.

16. The cooled electronics system of claim 15, wherein the evaporator comprises an air-to-liquid evaporator heat exchanger, the air-to-liquid evaporator heat exchanger comprising a refrigerant-liquid inlet plenum, a refrigerant-vapor outlet plenum and multiple fluid-carrying tubes connecting the refrigerant-liquid inlet plenum and refrigerant-vapor outlet plenum in fluid communication.

17. A method of facilitating cooling an electronics system, the electronics system comprising a system housing containing at least one electronics subsystem to be air-cooled, the method comprising:

obtaining a vapor-compression heat exchange system comprising an evaporator housing and an evaporator disposed therein, the evaporator housing being configured to couple to a first side of the system housing and extend at least partially between an air inlet side and an air outlet side of the system housing, the evaporator housing comprising an air inlet opening and an air outlet opening, wherein the vapor-compression heat exchange system further comprises a vapor-compression unit in fluid communication with the evaporator for exhausting heat from refrigerant circulating therethrough;

mounting the evaporator housing to the first side of the system housing;

obtaining a front cover and a back cover, the front cover being configured to cover an air inlet of the air inlet side of the system housing and the air outlet opening of the evaporator housing, and the back cover being configured to cover an air outlet of the air outlet side of the system housing and the air inlet opening of the evaporator housing;

mounting the front cover to at least one of the system housing or the evaporator housing to cover the air inlet of the system housing and the air outlet opening of the evaporator housing, and mounting the back cover to at least one of the system housing or the evaporator housing to cover the air outlet of the system housing and the air inlet opening of the evaporator housing, the front cover defining an air inlet plenum and the back cover defining an air outlet plenum, the air inlet plenum directing air from the air outlet opening of the evaporator housing to the air inlet side of the system housing, and the air outlet plenum directing air from the air outlet of the system housing to the air inlet opening of the evaporator housing, wherein the system housing, back cover, evaporator housing and front cover together facilitate establishing a closed loop airflow path passing through the air inlet and air outlet sides of the system housing and through the air inlet and air outlet openings of the evaporator housing, and wherein when operational, the vapor-compression heat exchange system at least partially cools air circulating through the closed loop path, thereby facilitating cooling of the at least one electronics subsystem of the electronics system; and wherein the vapor-compression heat exchange system further comprises a condenser housing enclosing the vapor-compression unit, and wherein the method further comprises mounting the condenser housing to a top side of the system housing, the vapor-compression unit further comprising an air-to-liquid condenser heat exchanger and an air-moving device for establishing ambient airflow across the air-to-liquid condenser heat exchanger, wherein ambient airflow across the air-to-liquid condenser heat exchanger is outside the closed loop airflow path defined by the back cover, evaporator housing, front cover and system housing and is from an air inlet side to an air outlet side of the condenser housing, and wherein the air inlet side of the condenser housing is in a plane parallel to the air inlet side of the system housing, and the air outlet side of the condenser housing is in a plane parallel to the air outlet side of the system housing.

18. The method of claim 17, wherein the front cover comprises a front door configured to hingedly mount along one edge to one of the system housing or the evaporator housing, and the back cover comprises a back door configured to hingedly mount along one edge to one of the system housing or the evaporator housing, wherein mounting the front cover further comprises hingedly mounting the one edge of the front cover to the system housing or the evaporator housing, and mounting the back cover further comprises hingedly mounting the one edge of the back cover to one of the system housing or the evaporator housing.

19. The method of claim 17, wherein the condenser housing has a width and a depth equal to a width and a depth, respectively, of the system housing.

* * * * *